United States Patent [19]

Terakado et al.

[11] Patent Number: 5,024,367

[45] Date of Patent: Jun. 18, 1991

[54] WIRE BONDING METHOD

[75] Inventors: Yoshimitsu Terakado; Nobuto Yamazaki, both of Tokyo, Japan

[73] Assignee: Kabushiki Kaisha Shinkawa, Tokyo, Japan

[21] Appl. No.: 523,007

[22] Filed: May 14, 1990

[30] Foreign Application Priority Data

May 15, 1989 [JP] Japan .................................. 1-118599

[51] Int. Cl.5 .................................. H01L 21/607
[52] U.S. Cl. .................................. 228/111; 228/179
[58] Field of Search ................. 228/110, 111, 179, 1.1, 228/4.5

[56] References Cited

U.S. PATENT DOCUMENTS

| 3,125,803 | 3/1964 | Rich | 228/4.5 |
| 3,128,649 | 4/1964 | Avila et al. | 228/4.5 |
| 4,140,263 | 2/1979 | Diepeveen | 228/110 |
| 4,496,095 | 1/1985 | Renshaw et al. | 228/111 |
| 4,614,292 | 9/1986 | Polansky et al. | 228/1.1 |

FOREIGN PATENT DOCUMENTS

| 1179082 | 6/1956 | Fed. Rep. of Germany | 228/110 |
| 242479 | 10/1988 | Japan | 228/110 |

Primary Examiner—Sam Heinrich
Attorney, Agent, or Firm—Koda and Androlia

[57] ABSTRACT

A wire bonding method in which a bonding wire is pressed against bonding surfaces by a bonding tool so that bonding is performed by applying ultrasonic vibrations to the bonding tool which makes scrubbing actions to smoothen the bonding surfaces while the bonding is being performed.

2 Claims, 2 Drawing Sheets

FIG. 3
PRIOR ART
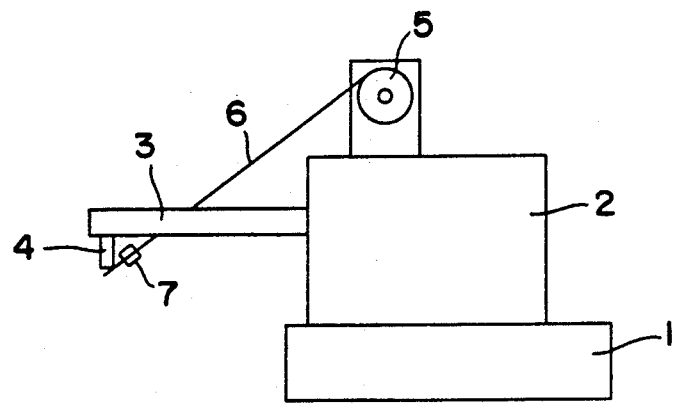
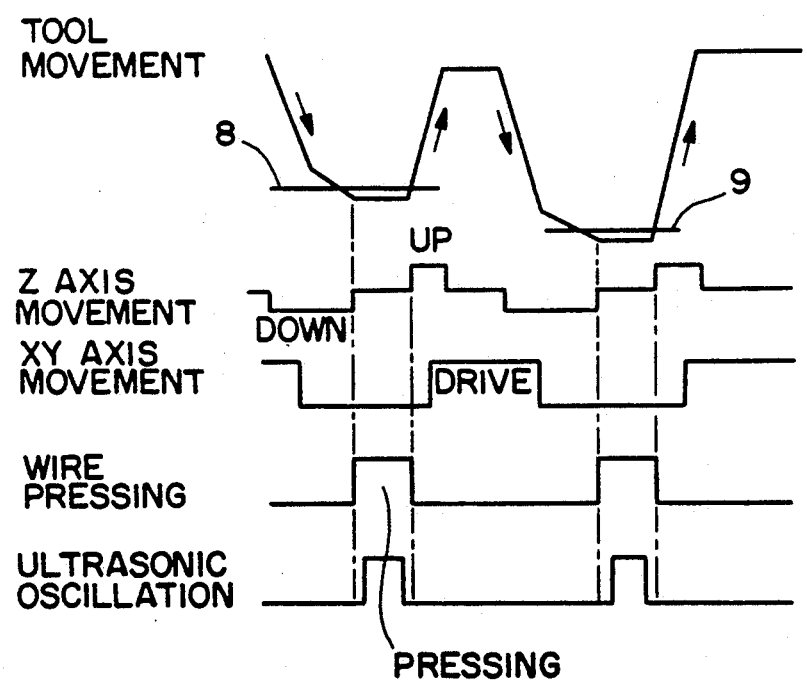
FIG. 4
PRIOR ART

WIRE BONDING METHOD

BACKGROUND OF THE INVENTION

1. Field of the Invention

The present invention relates to a wire bonding method, and more particularly to a thermocompression wire bonding method which uses ultrasonic vibrations.

2. Prior Art

FIG. 3 shows basic structure of a thermocompression wire bonder that uses ultrasonic vibrations.

The bonding head 2 is placed on a X-Y table 1, which moves in the X-Y directions located on a flat plane. A horn 3 that moved up and down and vibrates by a Z axis driver (not shown) is placed on the bonding head 2. A bonding tool 4 is provided at the end of the horn 3, and a wire 6 wound on a wire spool 5 is passed through a clamp 7 and brought to the bonding tool 4.

The bonding process for two bonding points (a first bonding surface 8 and a second bonding surface 9) is shown in FIG. 4.

The X-Y table 1, in FIG. 4, is moved horizontally by X-Y axis driver and the horn 3 is moved down by the Z axis driver so that the bonding tool 4 comes into contact with the first bonding surface 8. Then, the wire 6 is pressed on the first bonding surface after the bonding tool 4 is slightly further moved down. After this, the horn 3 makes ultrasonic oscillations so that ultrasonic vibrations are applied onto the bonding tool 4. Thus, the wire 6 is bonded to the first bonding surface 8.

The bonding tool 4 is then raised and moved horizontally in the X-Y directions and further moved down so that the wire 6 is released. Then, the bonding tool 4 comes into contact with the second bonding surface 9, and the wire 6 is bonded to the second bonding surface 9 in the same manner as is done in the first bonding surface 8.

The clamp 7 is then closed and moved up (in the direction in which the wire is inserted), so that the wire 6 is cut and removed from the second bonding surface 9. Thereafter, the bonding tool 4 is moved up, and the clamp 7 is opened, moved up, closed, and then moved down. Thus, the end of the wire 6 is brought to the tip end of the bonding tool 4.

However, in this prior art method, a sufficient bonding strength for the wire cannot be obtained because the entire surface of the wire 6 is not adequately bonded to the first and second bonding surfaces 8 and 9 if these bonding surfaces are in a poor bonding condition due to oxide, etc. accumulated on the bonding surfaces.

SUMMARY OF THE INVENTION

Accordingly, the object of the present invention is to provide a wire bonding method which can give an improved bonding strength.

The above object is accomplished by a method in which bonding is performed by the bonding tool which makes a scrubbing action on the bonding surface while the ultrasonic vibration is being applied to the bonding tool which is pressing the wire to the bonding surfaces.

In accordance with the method of the present invention, the wire is pressed onto the bonding surfaces, ultrasonic vibrations are applied to the bonding tool, and the bonding tool makes scrubbing actions, when the wire bonding is performed to bonding surfaces. Accordingly, even if the bonding surfaces are in poor bonding conditions due to accumulated oxide, etc., bonding is performed smoothly and sufficient wire bonding strength can be obtained because the oxides are removed by the scrubbing action of the bonding tool and bonding surfaces are smooth.

BRIEF DESCRIPTION OF THE DRAWINGS

FIG. 3 is a schematic illustration of a wire bonder in which the method of the present invention is used; and FIG. 4 is a graph showing the timing of prior art bonding action.

DETAILED DESCRIPTION OF THE INVENTION

Figure 1:
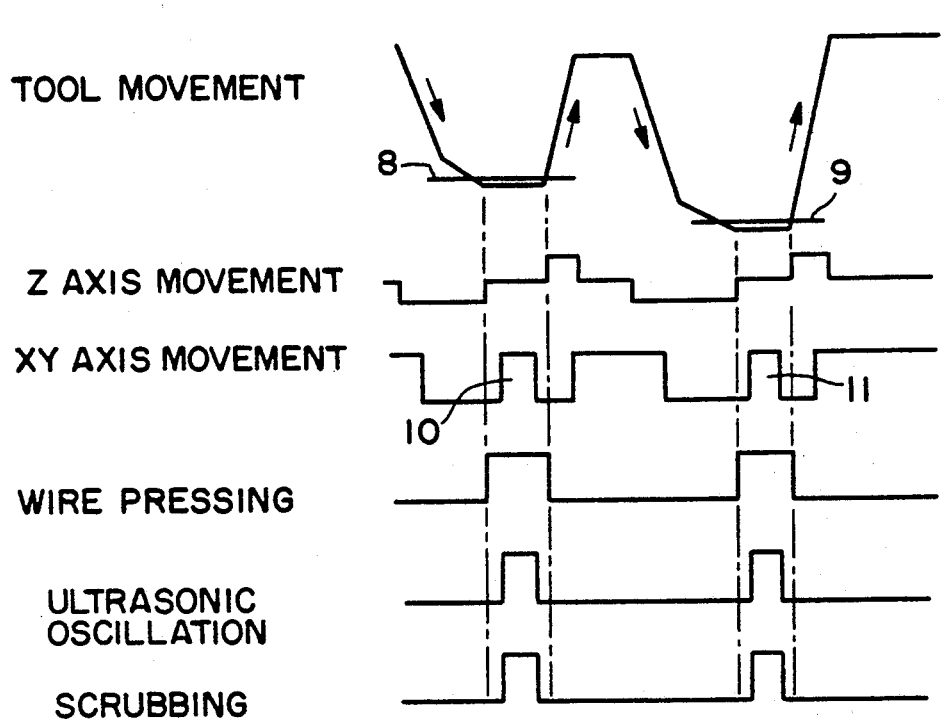
FIG. 1 is a graph showing the timing of bonding action of the present invention including movement of the bonding tool, Z axis drive, X-Y axis drive, wire pressure, ultrasonic vibrations and scrubbing action.

The present invention will be described with reference to FIGS. 1 and 2. Movement of the bonding tool 4, Z axis derive, the pressure onto the wire 6, and the timing of the oscillation of ultrasonic vibrations in FIG. 1 are the same as those in FIG. 4.

In the present invention, when the bonding tool 4 is pressing the wire 6 against the first and second bonding surfaces 8 and 9 and ultrasonic vibrations are applied to the bonding tool 4, scrub signals 10 and 11 for moving the X-Y table 1 as shown in FIG. 3 in the X-Y directions are given to the bonding tool 4.

Figure 2:
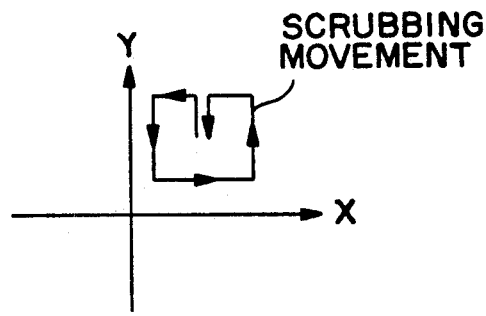
FIG. 2 shows one example of movement of the bonding tool which makes a scrubbing action.

The scrub signals 10 and 11 moves the bonding tool 4, for example, in the X direction, then Y direction and so on to make a scrubbing action as shown in FIG. 2. The moving distance of the bonding tool 4 in the X and Y directions is 3 to 50 μmm, for example, though it depends on the object on which the bonding is done.

The moving direction of the scrubbing action is not limited to that shown in FIG. 2 in which the bonding tool 4 moves along a square trace. The movement of the bonding tool which makes scrubbing action can be in a rectangular trace, a circular trace, or an elliptical trace, or by motion back and forth on a straight line.

As described above, because the wire 6 is bonded onto the bonding surfaces by the bonding tool which is making scrubbing action when receiving ultrasonic vibration and pressing the wire on the bonding surfaces. Accordingly, even if the bonding surfaces are poor bonding conditions, oxides, etc. can be removed by the scrubbing action of the bonding tool 4 and the entire surface of the wire 6 is placed and bonded to the bonding surfaces. Thus, sufficient wire bonding strength is obtained.

As seen from the above, because the wire is bonded to the bonding surfaces by the bonding tool which, being given ultrasonic vibrations, presses the wire onto the bonding surfaces and scrubs the bonding surfaces, the bonding is performed under good bonding conditions of the bonding surfaces. As a result, the entire surface of the wire is bonded onto the bonding surfaces, and sufficient wire strength is obtained.

We claim:

1. A wire bonding method in which a bonding wire is pressed against bonding surfaces by a bonding tool and bonding is performed by applying ultrasonic vibrations to said bonding tool, said method is further characterized in that said bonding tool is also moved in a lateral direction of the bonding surface to make a scrubbing action while said bonding tool to which said ultrasonic vibrations is applied presses said wire against said bonding surfaces.

2. A wire bonding method comprising the repetitive steps of:
 setting a bonding tool above a first bonding surface;
 lowering said bonding tool so that a bonding wire is pressed against said first bonding surface by said bonding tool;
 applying ultrasonic vibrations to said bonding tool;
 moving said bonding tool laterally of said bonding surface so that said bonding tool makes a scrubbing action in addition to vibrating ultrasonically to bond said wire to said first bonding point; and
 raising said bonding tool and moving said bonding tool above a second bonding surface.

* * * * *